United States Patent [19]

Nagayama et al.

[11] Patent Number: 4,757,477

[45] Date of Patent: Jul. 12, 1988

[54] DUAL-PORT SEMICONDUCTOR MEMORY DEVICE

[75] Inventors: Hiroshi Nagayama; Fumio Baba, both of Kawasaki, Japan

[73] Assignee: Fujitsu Limited, Kawasaki, Japan

[21] Appl. No.: 58,775

[22] Filed: Jun. 5, 1987

[30] Foreign Application Priority Data

Jun. 6, 1986 [JP]  Japan ................... 61-131439

[51] Int. Cl.[4] .............................. G11C 8/00
[52] U.S. Cl. ................................ 365/230
[58] Field of Search ...................... 365/189, 230

[56] References Cited

U.S. PATENT DOCUMENTS 4,541,076  9/1985  Bowers et al. ............... 365/189
4,656,610  4/1987  Yoshida et al. .............. 365/189

*Primary Examiner*—James W. Moffitt
*Attorney, Agent, or Firm*—Staas & Halsey

[57] ABSTRACT

A dual-port semiconductor memory device having one serial memory cell of a serial access memory provided for a predetermined number of bit line pairs. A transfer gate circuit is provided between the serial memory cell and the predetermined number of bit line pairs so that only one bit line pair is selectively coupled to one serial memory at one time. Access to the dual-port semiconductor memory device is made in n/m stages when there are n bit line pairs and m serial memory cells in the serial access memory.

7 Claims, 2 Drawing Sheets

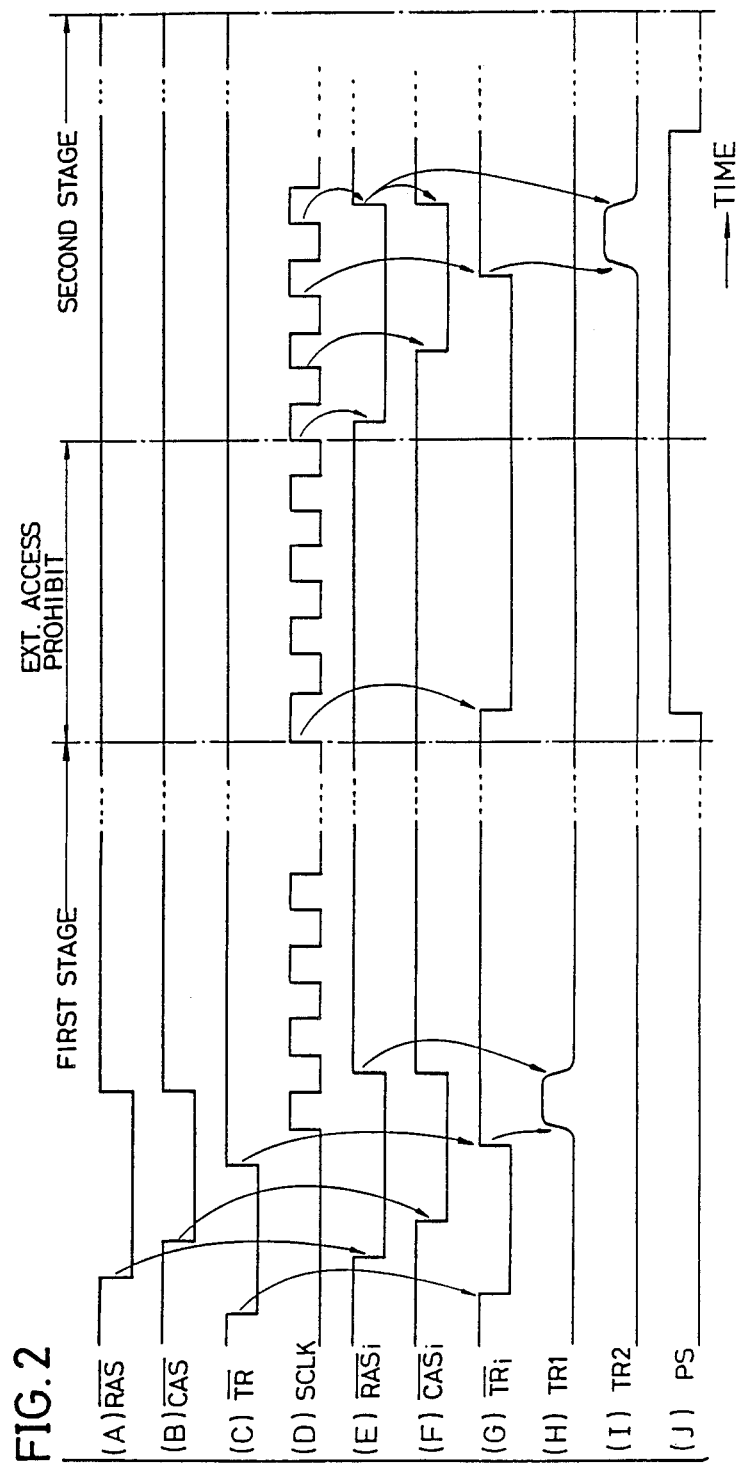

//  4,757,477

DUAL-PORT SEMICONDUCTOR MEMORY DEVICE

BACKGROUND OF THE INVENTION

The present invention generally relates to dual-port semiconductor memory devices, and more particularly to a dual-port dynamic random access memory device having a serial input/output circuit part with a simple circuit construction.

As one type of memory device, there is the so-called dual-port (or two-port) random access memory (RAM) which is accessible via two ports. There is a known dual-port static RAM (SRAM) wherein word lines and bit lines are provided in duplex with respect to a memory cell array of the SRAM, and a row address decoder, a column address decoder and the like are provided for each of two groups of word lines and bit lines. On the other hand, there is a known dual-port dynamic RAM (DRAM) wherein a shift register or a serial access memory is provided with respect to a memory cell array of the DRAM.

In other words, the bit lines of the memory cell array of the dual-port DRAM are coupled to corresponding stages of the shift register. Stored data in all of the memory cells belonging to a word line are obtained via the bit lines by selecting the word line. The data can be obtained serially from the shift register by entering the data from the bit lines to the shift register in parallel and successively shifting the entered data. On the other hand, write-in data can be entered serially into the shift register by successively shifting the write-in data. The data can be written into all of the memory cells belonging to a selected word line by simultaneously supplying the data from the shift register to the bit lines in parallel. Hence, input/output terminals of the shift register are coupled to one port of the dual-port DRAM, and normal input/output terminals for the memory cell array are coupled to the other port of the dual-port DRAM.

There is a conventional dual-port DRAM which employs a serial access memory for essentially carrying out the functions of the shift register described above. The serial access memory comprises serial memory cells, gates for coupling the serial memory cells to a data bus, and a pointer register for controlling the gates. According to this dual-port DRAM, it is impossible to transfer data between the serial memory cells as is done between stages of the shift register, but the functions of the serial access memory are essentially the same as those of the shift register in that the data from the serial memory cells are sequentially transferred on the data bus via the gates which are controlled by the pointer register. Accordingly, the serial access memory controls the serial input/output between the bit lines of the memory cell array and the data bus, and also the parallel input/output between the bit lines and the serial memory cells.

In the conventional dual-port DRAM which employs the serial access memory, each bit line pair corresponds one to one with a serial memory cell. For this reason, M serial memory cells are required when there are M bit line pairs in the memory cell array. Similarly, the shift register must have M stages when there are M bit line pairs in the memory cell array. But according to such a circuit construction, it is necessary to change the word construction when the word length of the serial port is changed. In other words, when the number of memory cells belonging to one word line (that is, the number of bit line pairs) is M, it is convenient when one word is formed by M bits because the serial access memory processes M bits in parallel. However, when the word length of the serial port and thus the bit length of the word which is processed is M/2, M/4, ..., there is a problem in that it is necessary to process the data in units of two words, four words, etc.) ... and it is inconvenient in that the word construction must be changed in order to access the memory cell array. In addition, the number of serial memory cells increases as the number of bit line pairs increases, and there is a problem in that the serial access memory inevitably occupies a large area of a memory chip. Especially in the case of a DRAM, the memory cells of the memory cell array are arranged at an extremely small pitch, and the provision of the serial access memory should not waste the reduced chip area.

SUMMARY OF THE INVENTION

Accordingly, it is a general object of the present invention to provide a novel and useful dual-port semiconductor memory device in which the problems described heretofore are eliminated.

Another and more specific object of the present invention is to provide a dual-port semiconductor memory device in which one serial memory cell of a series access memory is provided for a predetermined number of bit line pairs, and a transfer gate circuit is provided between the serial memory cell and the predetermined number of bit line pairs so that only one bit line pair is selectively coupled to the serial memory at one time. According to the dual-port semiconductor memory device of the present invention, it is possible to effectively reduce the number of serial memory cells in the serial access memory. Thus the chip area occupied by the serial access memory is considerably reduced compared to the conventional dual-port semiconductor memory device. In addition, there is no need to change the number of serial memory cells when the word length is changed.

Other objects and further features of the present invention will be apparent from the following detailed description when read in conjunction with the accompanying drawings.

BRIEF DESCRIPTION OF THE DRAWINGS

FIGS. 2(A) through 2(J) are timing charts of the operation of the system shown in FIG. 1.

DESCRIPTION OF THE PREFERRED EMBODIMENT

Figure 1:
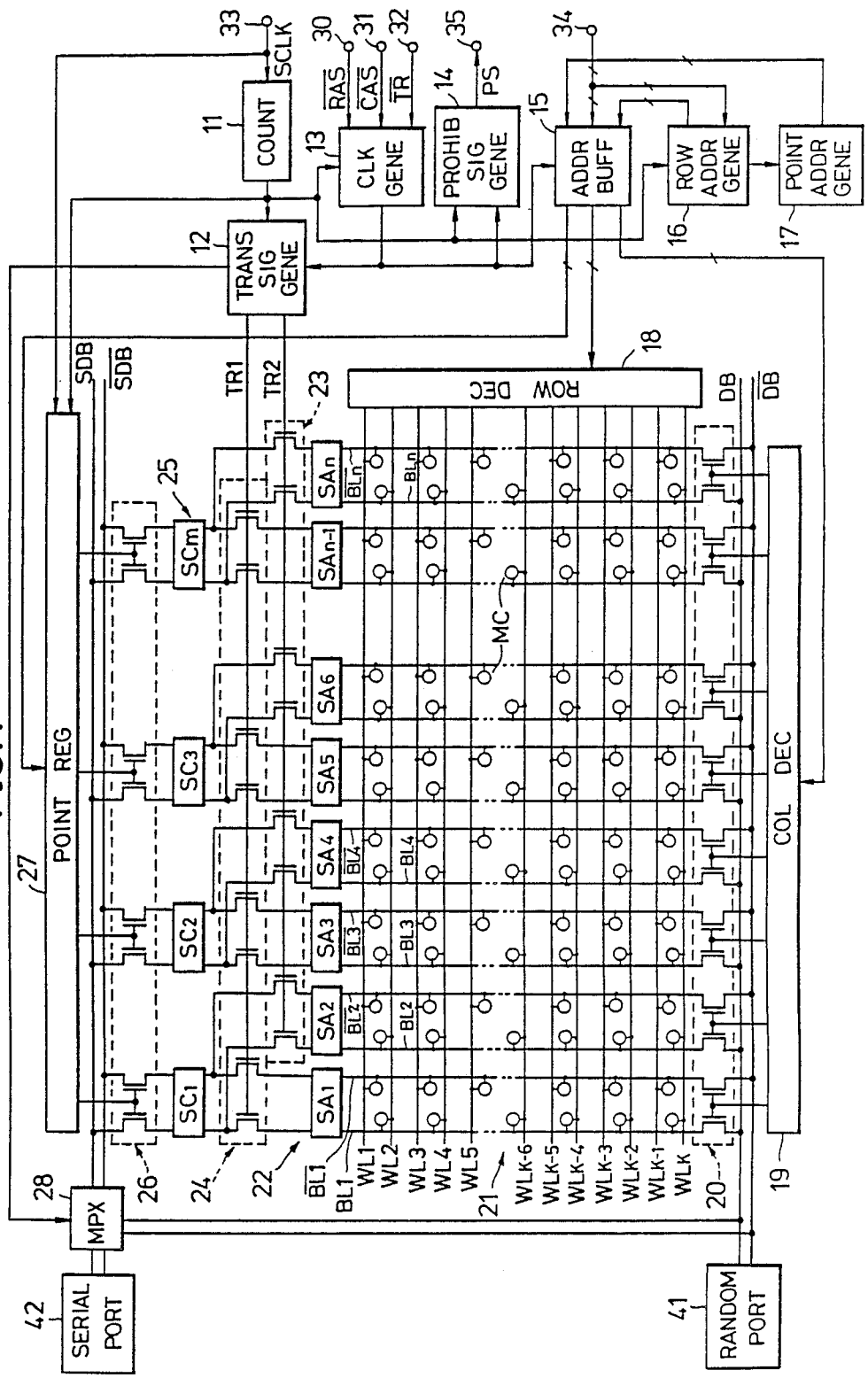
FIG. 1 is a system circuit diagram of an embodiment of the dual-port semiconductor memory device according to the present invention.

FIG. 1 is an embodiment of the dual-port semiconductor memory device according to the present invention. A dual-port DRAM generally comprises a counter 11, a transfer control signal generator 12, a clock generator 13, external access prohibit signal generator 14, an address buffer 15, a transfer row address generator 16, a pointer start address generator 17, a row address decoder 18, a column address decoder 19, a transfer gate circuit 20, a memory cell array 21, a sense amplifier circuit 22, transfer gate circuits 23 and 24, a serial access memory 25, a transfer gate circuit 26, a pointer register 27, and a multiplexer 28.

In the memory cell array 21, a memory cell MC is coupled between each bit line and word line. The memory cell MC is formed by a transistor and a capacitor, as is well known. In the present embodiment, n memory cells MC are coupled to one word line, and k memory cells MC are coupled to one bit line. As shown, there are n bit line pairs BL1 and $\overline{BL1}$, BL2 and $\overline{BL2}$, ..., BLn and $\overline{BLn}$, and k word lines WL1, WL2, ..., WLk. In other words, the dual-port DRAM is a folded bit line dual-port DRAM.

One end of each bit line is coupled to the column address decoder 19 via the transfer gate circuit 20, and the other end of each bit line is coupled to the sense amplifier circuit 22. As shown, the transfer gate circuit 20 comprises a pair of transistors for each bit line pair, where one transistor in each pair is coupled between one bit line and a data bus DB, the other transistor in each pair is coupled between the other bit line and a data bus $\overline{DB}$, and each pair of transistors is controlled by an output of the column address decoder 19.

The sense amplifier circuit 23 comprises n sense amplifiers SA1, SA2, ..., SAn, where one sense amplifier is provided for each bit line pair. The odd numbered sense amplifiers SA1, SA3, ... are coupled to the serial access memory 25 via the transfer gate circuit 24, while the even numbered sense amplifiers SA2, SA4, ... are coupled to the serial access memory 25 via the transfer gate circuit 23. The serial access memory 25 comprises m serial memory cells SC1, SC2, ..., SCm, where m=n/2 in the present embodiment. In other words, the sense amplifiers SA1 and SA2 are coupled to the serial memory cell SC1 via the respective transfer gate circuits 24 and 23, the sense amplifiers SA3 and SA4 are coupled to the serial memory cell SC2 via the respective transfer gate circuits 24 and 23, ..., and the sense amplifiers SAn−1 and SAn are coupled to the serial memory cell SCm via the respective transfer gate circuits 24 and 23.

The serial access memory 25 is coupled to the pointer register 27 via the transfer gate circuit 26. As shown, the transfer gate circuit 26 comprises a pair of transistors for each serial memory cell, where one transistor in each pair is coupled between one serial memory cell and a serial data bus SDB, the other transistor in each pair is coupled between the one serial memory cell and a serial data bus $\overline{SDB}$, and each pair of transistors is controlled by an output of the pointer register 27. Each pair of transistors in the gate transfer circuit 26 form a gate of the gate transfer circuit 26. The pointer register 27 comprises m stages, and all of the data in the m stages are "0" except for one datum which is "1". By successively shifting the data in the pointer register 27, one of the gates forming the transfer gate circuit 26 is sequentially opened.

The data buses DB and $\overline{DB}$ are coupled to the serial data buses SDB and $\overline{SDB}$ via the multiplexer 28. The data buses DB and $\overline{DB}$ are coupled to a random port 41 of the dual-port DRAM, and an output of the multiplexer 28 is coupled to a serial port 42 of the dual-port DRAM. The multiplexer 28 is controlled by a control signal from the transfer control signal generator 12.

In FIG. 1, the row address decoder 18, the column address decoder 19, the transfer gate circuit 20, the memory cell array 21, the sense amplifier circuit 22 and the pointer register 27 are basically the same as those of the conventional dual-port DRAM. Hence, detailed description on these parts of the dual-port DRAM will be omitted in the present specification.

A row address strobe $\overline{RAS}$ shown in FIG. 2(A) is applied to a terminal 30, a column address strobe $\overline{CAS}$ shown in FIG. 2(B) is applied to a terminal 31, and a transfer pulse $\overline{TR}$ shown in FIG. 2(C) is applied to a terminal 32. The row address strobe $\overline{RAS}$, the column address strobe $\overline{CAS}$ and the transfer pulse $\overline{TR}$ are respectively supplied to the clock generator 13. A shift clock SCLK shown in FIG. 2(D) is applied to a terminal 33 and is supplied to the counter 11 and the pointer register 27. The counter 11 produces an output pulse every time m pulses of the shift clock SCLK are counted. The output pulse of the counter 11 is supplied to the transfer control signal generator 12, the clock generator 13, the external access prohibit signal generator 14, the transfer row address generator 16 and the pointer register 27. An address is applied to a terminal 34 and is supplied to the address buffer 15.

The clock generator 13 produces therein an internal row address strobe $\overline{RASi}$ shown in FIG. 2(E), an internal column address strobe $\overline{CASi}$ shown in FIG. 2(F) and an internal transfer signal $\overline{TRi}$ shown in FIG. 2(G) from the signals received via the terminals 30, 31 and 32 and the output pulse of the counter 11. An internal clock from the clock generator 13 is obtained by carrying out a predetermined logic operation on the internal row address strobe $\overline{RASi}$, the internal column address strobe $\overline{CASi}$ and the internal transfer signal $\overline{TRi}$. This internal clock is supplied to the transfer signal generator 12, the external access prohibiting signal generator 14 and the transfer row address generator 16.

An output of the transfer row address generator 16 is supplied to the pointer start address generator 17. Outputs of the transfer row address generator 16 and the pointer start address generator 17 are respectively supplied to the address buffer 15. An output row address and an output column address of the address buffer 15 are supplied to the row address decoder 18 and the column address decoder 19, respectively. Furthermore, an output address of the address buffer 15 is supplied to the pointer register 27.

The transfer control signal generator 12 generates transfer control signals TR1 and TR2 respectively shown in FIGS. 2(H) and 2(I) responsive to the outputs of the counter 11 and the clock generator 13. On the other hand, the external access prohibit signal generator 14 generates an external access prohibit signal PS shown in FIG. 2(J) from the outputs of the counter 11 and the clock generator 13. The external access prohibit signal PS is output via a terminal 35.

A description will now be given of the signal generating timings of the transfer control signal generator 12, the clock generator 13 and the external access prohibit signal generator 14. The internal clock generated from the clock generator 13 is used to control the operations of the DRAM including the operations related to the data transfer, such as the entering of the address, the setting of the counter 11 and the setting of the pointer register 27 (although the illustration of the signal paths therefor is omitted for convenience).

First, the transfer control signal TR1 generated from the transfer control signal generator 12 rises as shown in FIG. 2(H) responsive to the output pulse of the counter 11 and the internal clock from the clock generator 13. The rise and fall in the transfer control signal TR1 are respectively generated responsive to a rise in the internal transfer signal $\overline{TRi}$ and a rise in the internal row address strobe $\overline{RASi}$. The counter 11 counts the pulses of the shift clock SCLK, the output m-bit address of the address buffer 15 input to the pointer register 27 is successively shifted in response to the shift clock SCLK, and the first data transfer is started.

For example, at a time when a bit, seven bits before the last bit is serially output, the external access prohibit signal generator 14 generates the external access prohibit signal PS which rises at this time as shown in FIG. 2(J). In addition, the clock generator 13 generates the internal transfer signal $\overline{TRi}$ which falls at this time as shown in FIG. 2(G). The external access prohibit signal generator 14 comprises a 2-input AND circuit (not shown) supplied with the output pulse of the counter 11 and a fixed signal which has a high level when the counted value in the counter 11 is, for example, m−6 or greater, and the external access prohibit signal PS is generated based on an output of the AND circuit and the internal clock from the clock generator 13. The clock generator 13 comprises a first 2-input AND circuit (not shown) similar to the AND circuit described above. The fall in the internal transfer signal $\overline{TRi}$ is generated based on an output of the first AND circuit.

At a time when the bit, three bits before the last bit, is serially output, the clock generator 13 generates therein the internal row address strobe $\overline{RASi}$ which falls, the internal column address strobe $\overline{CASi}$ which falls and the internal transfer signal $\overline{TRi}$ which rises sequentially as shown in FIGS. 2(E), 2(F) and 2(G). The clock generator 13 comprises a second 2-input AND circuit (not shown) supplied with the output pulse of the counter 11 and a fixed signal which has a high level when the counted value in the counter 11 is m−2 or greater, a third 2-input AND circuit (not shown) supplied with the output pulse of the counter 11 and a fixed signal which has a high level when the counted value in the counter 11 is m−1 or greater, and a fourth 2-input AND circuit (not shown) supplied with the output pulse of the counter 11 and a fixed signal which has a high level when the counted value in the counter 11 is m or greater. The falls in the internal row and column address strobes $\overline{RASi}$ and $\overline{CASi}$ and the rise in the internal transfer signal $\overline{TRi}$ are respectively generated based on the outputs of the second, third and fourth AND circuits.

At the same time, the transfer row address generator 16 generates the transfer row address responsive to the input address and the internal clock, and the pointer start address generator 17 generates a start address (data) of the pointer register 27 from the output of the transfer row address generator 16. The address buffer 15 generates the row address, the column address and the start address for the pointer register 27 based on the input address, the addresses from the address generators 16 and 17 and the internal clock.

Then, the transfer control signal TR2 rises responsive to the rise in the internal transfer signal $\overline{TRi}$ and falls responsive to rises in the internal row and column address strobes $\overline{RASi}$ and $\overline{CASi}$ as shown in FIG. 2(I). The external access prohibit signal PS falls as shown in FIG. 2(J), and the second data transfer is started. For example, the rise in the internal row address strobe $\overline{RASi}$ during the second data tranfer may be generated based on an output of a fifth 2-input AND circuit (not shown) within the clock generator 13, where the fifth AND circuit is supplied with the output pulse of the counter 11 and a fixed signal which has a high level when the counted value in the counter 11 is m+1 or greater.

The timings with which the external access prohibit signal PS is generated and the internal row address strobe $\overline{RASi}$ falls in the second data transfer may be set depending on the operating frequency and serial transfer frequency of the DRAM. Further, the internal row and column address strobes $\overline{RASi}$ and $\overline{CASi}$ and the internal transfer signal $\overline{TRi}$ may be generated by carrying out predetermined logic operations on the signals received via the terminals 30, 31 and 32 and the output pulse of the counter 11. Hence, it is not essential for the clock generator 13 to be provided with the first through fifth AND circuits described before.

Next, a description will be given on the operation of the dual-port DRAM shown in FIG. 1 during a readout operation. When the word line WL1 is selected, for example, all of the memory cells MC belonging to the word line WL1 are coupled to the bit lines $\overline{BL1}$, $\overline{BL2}$, ..., $\overline{BLn}$ and vary the potential at these bit lines. For example, the high or low potential of the bit line $\overline{BL1}$ is discriminated in the sense amplifier SA1 with reference to the other bit line BL1 which forms a bit line pair with the bit line $\overline{BL1}$, by using a reference potential Vcc/2, where Vcc denotes a power source voltage. The discrimination result in the sense amplifier SA1 is amplified by setting the bit line having the high potential to Vcc and setting the other bit line having the low potential to Vss.

When it is assumed that the gates of the transfer gate circuit 24 are initially open responsive to a rise in the transfer control signal TR1 shown in FIG. 2(H), the bit line potentials (that is, data) from the sense amplifiers SA1, SA3, ... are entered into the serial memory cells SC1, SC2, ... via the transfer gate circuit 24. After the data are entered into the serial memory cells SC1, SC2, ..., the transfer control signal TR1 falls as shown in FIG. 2(H) because the serial access memory 25 no longer needs to be coupled to the bit lines.

The address (data) "1000 ..." in the pointer register 27 is shifted in response to the shift clock SCLK, and the transfer gates of the transfer gate circuit 26 are sequentially opened from the gate on the left to the gates on the right in FIG. 1. As a result, the data from the serial memory cells SC1, SC2, ... are sequentially transferred on the serial data buses SDB and $\overline{SDB}$ in the form of a serial signal. The data on the data bus SDB are the data from the bit lines BL1, BL3, ..., and the data on the data bus $\overline{SDB}$ are the data from the bit lines $\overline{BL1}$, $\overline{BL3}$, ...

When the counter 11 counts m pulses of the shift clock SCLK, the transfer control signal TR2 from the transfer signal generator 12 rises as shown in FIG. 2(I) so as to open the gates of the transfer gate circuit 23. In this state, the transfer control signal TR1 has a low level. Hence, the bit line potentials (that is, data) from the sense amplifiers SA2, SA4, ... are entered into the serial memory cells SC1, SC2, ... via the transfer gate circuit 23. After the data are entered into the serial memory cells SC1, SC2, ..., the transfer control signal TR2 falls as shown in FIG. 2(I) because the serial access memory 25 no longer needs to be coupled to the bit lines.

The address (data) in the pointer register 27 is shifted responsive to the shift clock SCLK, and the transfer gates of the transfer gate circuit 26 are sequentially opened from the gate on the left to the gates on the right in FIG. 1. As a result, the data from the serial memory cells SC1, SC2, ... are sequentially transferred on the serial data buses SDB and $\overline{SDB}$ in the form of a serial signal. The data on the data bus SDB are the data from the bit lines BL2, BL4, . . . , and the data on the data bus $\overline{SDB}$ are the data from the bit lines $\overline{BL2}$, $\overline{BL4}$, . . .

An operation similar to that described heretofore is carried out during the read-out operation every time one word line is selected, and the data from all of the memory cells belonging to the selected word line are successively read out in two read-out stages. In the present embodiment, the data from the odd numbered bit lines are read out in a first read-out stage and the data from the even numbered bit lines are read out in a second read-out stage, responsive to the transfer control signals TR1 and TR2.

Next, a description will be given regarding the operation of the dual-port DRAM during a write-in operation. In this case, write-in data are sequentially transferred on the serial data buses SDB and $\overline{SDB}$ via the serial port 42, in synchronism with the shift clock SCLK. The data in the pointer register 27 is shifted responsive to the shift clock SCLK, and the transfer gates of the transfer gate circuit 26 are sequentially opened from the gate on the left to the gates on the right in FIG. 1. As a result, the write-in data are sequentially entered into the serial memory cells SC1, SC2, . . . from the serial data buses SDB and $\overline{SDB}$. When all of the write-in data are entered into the serial memory cells SC1, SC2, . . . , SCm, the gates of the transfer gate circuit 24 are opened responsive to a rise in the transfer control signal TR1, and the sense amplifiers SA1, SA3, . . . set the bit line potentials of the bit lines BL1 and $\overline{BL1}$, BL3 and $\overline{BL3}$, . . . in accordance with the write-in data. In this state, the row address decoder 18 is already supplied with the row address from the address buffer 15 so as to select the word line WL3, for example. Hence, out of the memory cells MC belonging to the selected word line WL3, only the memory cells MC coupled to the bit lines $\overline{BL1}$, $\overline{BL3}$, . . . store the incoming write-in data.

When the counter 11 counts m pulses of the shift clock SCLK, the transfer control signal TR2 from the transfer signal generator 12 rises so as to open the gates of the transfer gate circuit 23. In this state, the transfer control signal TR1 has a low level. Hence, the write-in data sequentially transferred on the serial data buses SDB and $\overline{SDB}$ via the serial port 42 are sequentially entered into the serial memory cells SC1, SC2, . . . When all of the write-in data are entered into the serial memory cells SC1, SC2, . . . , SCm, the sense amplifiers SA2, SA4, . . . set the bit line potentials of the bit lines BL2 and $\overline{BL2}$, BL4 and $\overline{BL4}$, . . . in accordance with the write-in data. Therefore, out of the memory cells MC belonging to the selected word line WL3, only the memory cells MC coupled to the bit lines $\overline{BL2}$, $\overline{BL4}$, . . . stores the incoming write-in data.

When n=16 and the serial write-in data comprise data D1, D2, D3 . . . , D16, for example. The data D1, D2, . . . , D8 are written into the odd numbered memory cells MC (that is, memory cells MC coupled to the bit lines $\overline{BL1}$, $\overline{BL3}$, . . . ) belonging to the selected word line WL3 in a first write-in stage. The data D9, D10, . . . , D16 are written into the even numbered memory cells MC (that is, memory cells MC coupled to the bit lines $\overline{BL2}$, $\overline{BL4}$, . . . ) belonging to the selected word line WL3 in a second write-in stage. Similarly, during the read-out operation described before, the data D1, D2, . . . , D8 are read out from the odd numbered memory cells MC belonging to the selected word line WL1 in the first read-out stage, and the data D9, D10, . . . , D16 are read out from the even numbered memory cells MC belonging to the selected word line WL1 in the second read-out stage. Therefore, the write-in and read-out sequences will not be disturbed by the two stage write-in and read-out.

In the present embodiment, the number m of serial memory cells forming the serial access memory 25 is ½ the number n of bit line pairs. However, the number m of serial memory cells is not limited to ½ the number n of bit line pairs, and m may take other values such as ¼, ⅛ and 1/N, where N is an integer.

As described heretofore, the access to the dual-port DRAM is made in a plurality of stages. In the case where the word length is n/m, the serial access memory 25 is formed by m serial memory cells, and the access is made in n/m stages. For this reason, the dual-port DRAM according to the present invention may easily handle the change in the word length.

The serial memory cells of the serial access memory 25 may be arranged so as to selectively switch and couple to a first bit line group on the right portion of the memory cell array 21 and a second bit line group on the left portion of the memory cell array 21. In this case, however, the wiring at the switching section, that is, the transfer gate circuits 23 and 24, becomes complex. On the other hand, the arrangement shown in FIG. 1 is advantageous in that the wiring at the switching part is relatively simple.

During the read-out operation of the described embodiment, the data are read out from the odd numbered memory cells belonging to the selected word line in the first read-out stage and the data are read out from the even numbered memory cells belonging to the same selected word line in the second read-out stage. However, it is possible to read out the data from the odd numbered memory cells belonging to one selected word line in the first read-out stage and to read out the data from the even numbered memory cells belonging to another selected word line in the second read-out stage.

Further, the present invention is not limited to these embodiments, but various variations and modifications may be made without departing from the scope of the present invention.

What is claimed is:

1. A dual-port semiconductor memory device comprising:
   a row address decoder, receiving a row address, for decoding the row address;
   a column address decoder, receiving a column address, for decoding the column address;
   a plurality of bit lines including n bit line pairs, where n is an integer;
   a plurality of word lines intersecting said bit lines;
   a memory cell array comprising an array of memory cells formed at the intersections of word lines and bit lines, a specific word line being selected in response to the decoded row address from said row address decoder;
   a first transfer gate means coupled to said n bit line pairs, for selecting at least one of said n bit line pairs in response to the decoded column address from said column address decoder;
   a first pair of data buses coupled to said first transfer gate means;
   a first port coupled to said first pair of data buses;
   sense amplifier means, connected between said n bit line pairs, for sensing and amplifying a potential difference between two bit lines in each of said n bit line pairs;

second transfer gate means coupled to said sense amplifier means;

serial access memory means coupled to said second transfer gate means; said second transfer gate means selectively coupling groups of n/m bit line pairs to said serial access memory means through said sense amplifier means in n/m sequential stages, where m is an integer smaller than n and each of said groups of n/m bit line pairs are formed by m different bit line pairs;

third transfer gate means coupled to said serial access memory means;

a second pair of data buses coupled to said serial access memory means through said third transfer gate means; said third transfer gate means sequentially coupling the m bit line pairs in each of said groups of bit line pairs to said second pair of data buses in each of said n/m stages through said sense amplifier means and said second transfer gate means; and a second port coupled to said second pair of data buses.

2. A dual-port semiconductor memory device as claimed in claim 1, wherein said serial access memory means comprises m serial memory cells, each of said m serial memory cells being coupled to corresponding ones of said bit lines pairs in each of said groups of n/m bit line pairs through said second transfer gate means and said sense amplifier means.

3. A dual-port semiconductor memory device as claimed in claim 1, wherein said second transfer gate means comprises n/m transfer gate circuits, each of said n/m transfer gate circuits comprising m gates for coupling said m bit line pairs in one of said groups of bit line pairs to said serial access memory means through said sense amplifier means.

4. A dual-port semiconductor memory device as claimed in claim 1, wherein said third transfer gate means comprises a pointer register and a transfer gate circuit including m gates for coupling the m bit line pair in each of said groups of bit line pairs to said second pair of data buses in each of said n/m stages, said m gates being sequentially opened by an output from said pointer register.

5. A dual-port semiconductor memory device as claimed in claim 4, wherein said pointer register enters a predetermined m-bit data which is successively shifted, said m gates of said second transfer gate means being supplied with an m-bit parallel output from said pointer register and opened sequentially.

6. A dual-port semiconductor memory device as claimed in claim 1, further comprising:

a counter for counting a shift clock; and a transfer control signal generator, connected to said counter, for generating n/m transfer control signals responsive to an output from said counter, said second transfer gate means coupling one of said groups of n/m bit line pairs to said serial access memory means through said sense amplifier means in each of the n/m stages responsive to one of said n/m transfer control signals, said third transfer gate means sequentially coupling the m bit line pairs in each of said groups of bit line pairs to said second pair of data buses in each of said n/m stages responsive to said shift clock.

7. A dual-port semiconductor memory device as claimed in claim 6, wherein said second transfer gate means comprises n/m transfer gate circuits, each of said n/m transfer gate circuits comprising m gates for coupling the m bit line pairs in one of said groups of bit line pairs to said serial access memory means through said sense amplifier means, said transfer control signal generator generating a transfer control signal for opening one of said n/m transfer gate circuits every time a counted value in said counter reaches m.

* * * * *